United States Patent
Zhang

[19]

[11] Patent Number: 6,071,389
[45] Date of Patent: Jun. 6, 2000

[54] DIFFUSION BONDED SPUTTER TARGET ASSEMBLY AND METHOD OF MAKING

[75] Inventor: Hao Zhang, Grove City, Ohio

[73] Assignee: Tosoh SMD, Inc., Grove City, Ohio

[21] Appl. No.: 09/375,742

[22] Filed: Aug. 17, 1999

Related U.S. Application Data

[60] Provisional application No. 60/097,442, Aug. 21, 1998.

[51] Int. Cl.[7] .............................. C23C 14/34; B23K 20/00
[52] U.S. Cl. ................................ 204/298.12; 204/298.13; 228/115; 228/116; 228/164; 228/165; 228/174; 228/203; 228/194; 228/195; 428/650; 428/655; 428/687; 428/615; 419/48; 419/49
[58] Field of Search ......................... 204/298.12, 298.13; 228/115, 116, 164, 165, 174, 203, 194, 195; 428/650, 655, 687, 615; 419/48, 49

[56] References Cited

U.S. PATENT DOCUMENTS

| | | |
|---|---|---|
| 4,135,286 | 1/1979 | Wright et al. . |
| 4,731,116 | 3/1988 | Kny . |
| 4,838,935 | 6/1989 | Dunlop et al. . |
| 5,215,639 | 6/1993 | Boys . |
| 5,230,459 | 7/1993 | Mueller et al. ........................ 226/164 |
| 5,234,487 | 8/1993 | Wickersham et al. . |
| 5,244,556 | 9/1993 | Inoue . |
| 5,693,203 | 12/1997 | Ohhashi et al. ................... 204/298.12 |
| 5,836,506 | 11/1998 | Hunt et al. ............................. 228/172 |
| 5,857,611 | 1/1999 | Gilman et al. ......................... 228/193 |
| 5,904,966 | 5/1999 | Lippens ............................... 428/36.91 |

FOREIGN PATENT DOCUMENTS

| | | |
|---|---|---|
| WO 98/26107 | 6/1998 | WIPO . |
| WO 98/41669 | 9/1998 | WIPO . |

*Primary Examiner*—Alan Diamond
*Attorney, Agent, or Firm*—Biebel & French

[57] ABSTRACT

A sputter target assembly includes a cobalt target diffusion bonded to an aluminum or copper backing plate by means of a titanium interlayer. The sputter target assembly may be made by hot vacuum pressing or, preferably, by hot isostatically pressing the target, interlayer and backing plate together. Preferably, the titanium interlayer is provided as a foil, but may also be formed on a mating surface of either the target or the backing plate by electroplating, sputtering, electroless plating, or plasma spraying. The target may be advantageously machined with grooves defining salient points prior to providing the interlayer.

10 Claims, 4 Drawing Sheets

6,071,389

DIFFUSION BONDED SPUTTER TARGET ASSEMBLY AND METHOD OF MAKING

CROSS-REFERENCES TO RELATED APPLICATIONS

This application claims the benefit of U.S. Provisional Application Ser. No. 60/097,442, filed Aug. 21, 1998.

BACKGROUND OF THE INVENTION

The present invention generally relates to a design for and a method of making a sputter target assembly for physical vapor deposition thin film coating processes. In particular, the invention relates to a sputter target assembly having a cobalt target diffusion-bonded to an aluminum or copper backing plate, and a method for making such assemblies.

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits on the receiving surface of the substrate to form a thin layer or film.

The sputter target is heated during the sputtering process by the kinetic energy of the bombarding gas ions imparted to the sputtering target as thermal energy. This heat is dissipated by thermal exchange with a cooling fluid typically circulated beneath or around a backing plate which is bonded to the sputter target along an interface opposite the sputtering surface.

Sputter targets of high-purity metals or metal alloys attached to aluminum- or copper-based backing plates are typically used to deposit thin films on substrates such as, for example, semiconductor devices. These sputter target assemblies provide mechanical and electrical attachment of the target material to the sputter apparatus, provide vacuum sealing surfaces to maintain proper sputter chamber environmental conditions, and typically provide a path of heat removal for effective cooling of the target material during sputter deposition.

High-purity metal and metal alloy sputter targets historically have been solder-bonded to copper alloy backing plates. In particular, solder bonding is currently used to bond cobalt sputter targets to copper or aluminum backing plates. However, as sputter target assemblies undergo heating and cooling, the bond between the target and the backing plate is subjected to stresses that may lead to failure of the bond. In particular, solder bonding typically results in relatively weak bond strength between cobalt sputter targets and copper or aluminum backing plates. The bond strength further decreases as temperature increases to those typically encountered during the sputtering process. Higher melting temperature solders used for high power applications are stronger but are less forgiving of the stresses developed in the material systems. In addition, typical solders have low melting points and high vapor pressures and represent a potential source of contamination within the sputtering chamber during sputter deposition. Currently, solder bonding processes produce bonds having approximately 3 ksi ($2\times10^7$ N/m$^2$) bond strength for cobalt targets bonded to copper backing plates. Sputter target assemblies comprising cobalt targets bonded to aluminum backing plates exhibit even weaker bond strength. As a consequence, the use of solder bonding has imposed practical limits on the sizes of sputter targets and the levels of sputtering power which sputter target assemblies can sustain.

Accordingly, there remains a need for a method of bonding high-purity cobalt and cobalt alloys to copper and aluminum backing plates so that the bonded joint will be mechanically sound so as to allow for higher levels of sputtering power and larger sputter target designs without risk of deflection or debonding in use at elevated temperatures.

Additionally, there is a need for sputter target assemblies having cobalt targets and copper or aluminum backing plates that can withstand prolonged high-power sputter usage periods without significant target-backing plate debonding.

SUMMARY OF THE INVENTION

These and other objects of the invention are met by a method for manufacturing or fabricating sputter target assemblies in which high-purity cobalt or cobalt alloy sputter targets are diffusion bonded to backing plates formed from copper, aluminum, or alloys thereof through the provision of a titanium interlayer. The method is of particular utility in connection with the joining of cobalt sputter targets to aluminum backing plates which otherwise tend to form low-temperature brittle intermetallic phases when diffusion bonded directly together.

More specifically, the invention contemplates an improved method for joining mating surfaces of a cobalt or cobalt alloy sputter target and a backing plate of copper, copper alloy, aluminum, or aluminum alloy to form a sputter target assembly. The method comprises the steps of providing a cobalt or cobalt alloy target having a mating surface; providing an interlayer of titanium, tantalum or chromium; providing a backing plate made of copper, copper alloy, aluminum, or aluminum alloy having a mating surface corresponding to the mating surface of the target; pressing the sputter target and the backing plate together along the mating surfaces with the interlayer interposed between the mating surfaces; and holding the sputter target, the interlayer, and the backing plate in contact at a temperature just below the melting points of the target, the interlayer, and the backing plate materials to promote diffusion bonding.

Prior to pressing the target, interlayer, and backing plate together, one of the mating surfaces of either the target or the backing plate may be optionally roughened to form a plurality of salient portions projecting from the roughened surface. A preferred method for roughening one of the mating surfaces comprises machining a series of concentric grooves therein.

In a preferred form of the invention, titanium is used as the interlayer and is provided in the form of a foil approximately 10–50, preferably about 30 microns thick. Alternatively, without limitation, the interlayer may be provided by covering the roughened surface with a layer of titanium by means of plating, sputtering, electroless plating, or plasma spraying. The sputter target and backing plate may then be joined along the mating surfaces by hot isostatic pressing or vacuum hot pressing. The process results in a sputter target assembly wherein the cobalt or cobalt alloy target is diffusion bonded to the copper, copper alloy, aluminum, or aluminum alloy material of the backing plate through the medium of the titanium interlayer.

The invention will be further described in the appended drawings and the following detailed description.

DETAILED DESCRIPTION OF THE PREFERRED EMBODIMENT

Figure 1:
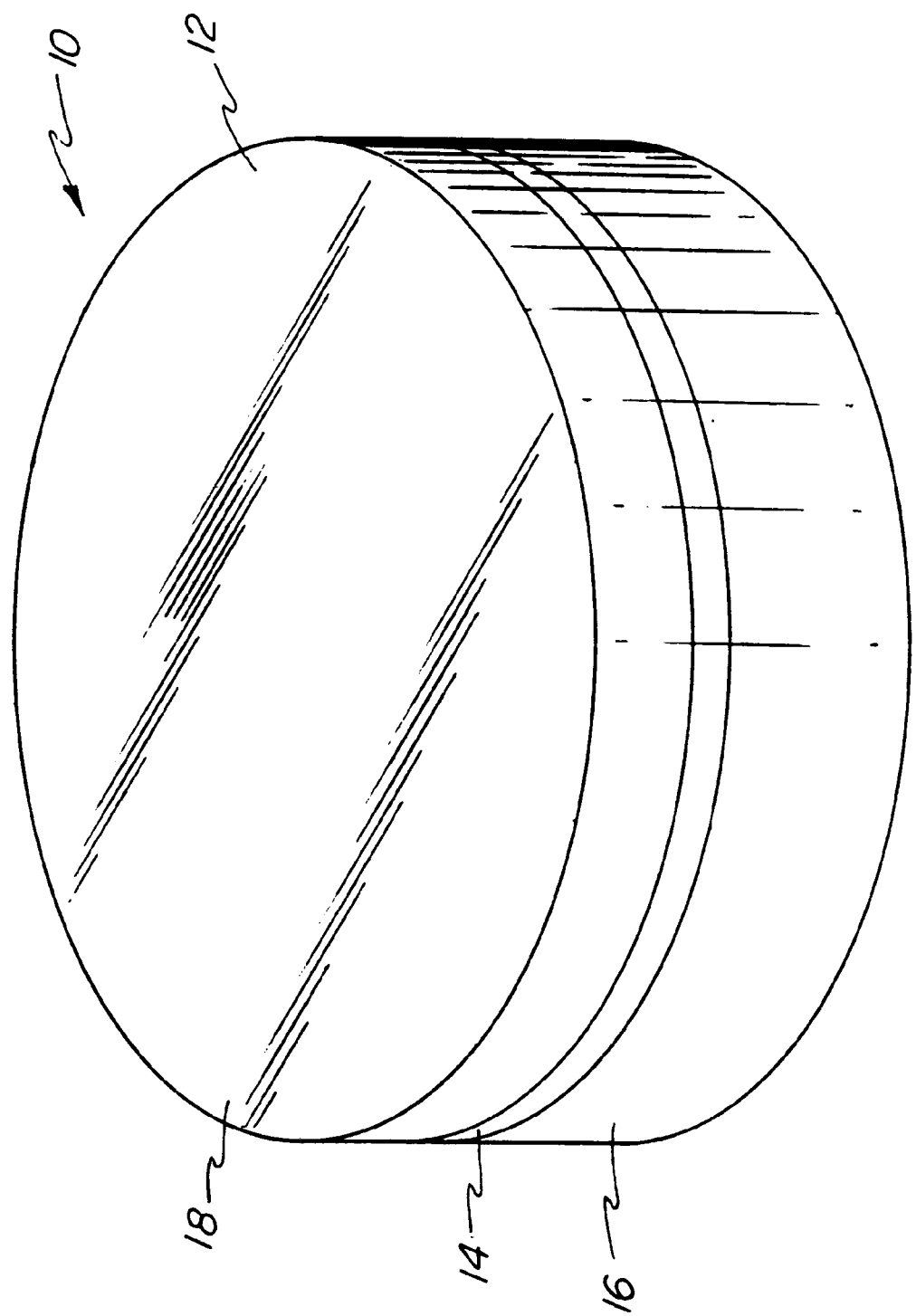
FIG. 1 shows a sputter target assembly made in accordance with the present invention.

Referring to FIG. 1, a sputter target assembly 10 includes a target 12 which is bonded to an interlayer 14, which in turn is bonded to a backing plate 16. The target plate 12 may be made of cobalt, or a material of which cobalt is the principal constituent. The interlayer 14 may be made of titanium or titanium alloy foil, and may have a thickness of about 30 microns. The backing plate 16 may be made of aluminum, aluminum alloy, copper, or copper alloy. The bonds between the target 12 and the interlayer 14, and the interlayer 14 and the backing plate 16, are of the interdiffusion type wherein the target plate 12 is joined to the interlayer 14, and the interlayer 14 is joined to the backing plate 16.

The interface between the target 12 and the interlayer 14 defines a first intermediate portion which is thought to comprise an intermetallic phase including cobalt or cobalt alloy and titanium. The interface between the interlayer 14 and the backing plate 16 defines a second intermediate portion which is thought to comprise an intermetallic phase including titanium and copper or aluminum. Depending on the thickness of the interlayer 14, an interlayer portion composed primarily of titanium may lie between the first and second intermediate portions. As shown, the sputter target assembly 10 includes a relatively planar surface 18 from which sputtering material is to be ejected to coat a desired substrate during the sputtering process.

Figure 2:
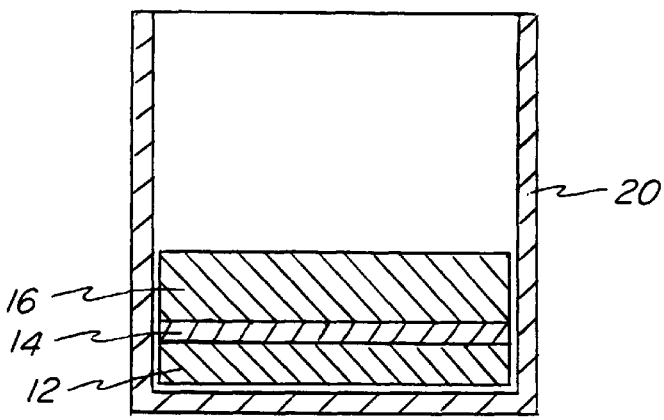
FIGS. 2–4 diagrammatically illustrate a series of steps performed in accordance with the invention for making the sputter target assembly of FIG. 1.
Figure 3:
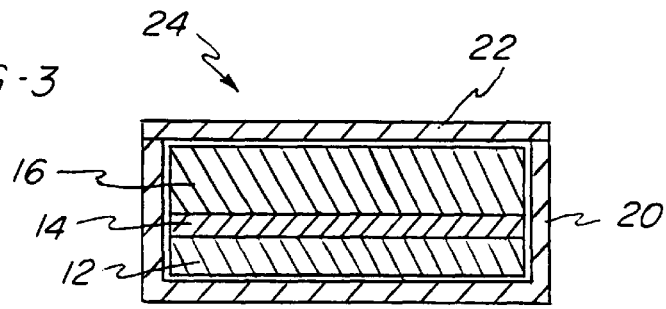
Figure 4:
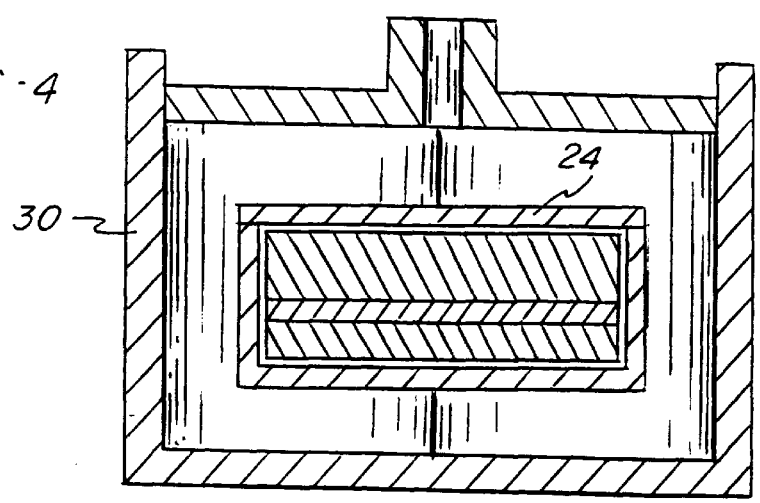

With reference to FIGS. 2–4, a preferred method of producing the sputter target assembly 10 of the present invention comprises placing a cobalt target plate 12 within a HIP can 20. The target plate 12 preferably includes a freshly machined flat lower or mating surface facing upwardly within the can 20.

The target plate 12 is overlaid with an interlayer 14 preferably consisting of a titanium foil. The interlayer 14 is preferably about 30 microns thick, but may be of other thicknesses provided that it is sufficiently thick so that strong metallic bonds will form between the target 12 and the interlayer 14, and between the interlayer 14 and a backing plate 16. The interlayer 14 is then overlaid with the backing plate 16 that preferably includes a freshly machined flat upper or mating surface facing downwardly within the can 20. The backing plate 16 may be made of aluminum, aluminum alloy, copper, or copper alloy.

After the target 12, the interlayer 14, and the backing plate 16 are placed in the can 20, a top closure plate 22 is welded onto the can 20 to form a can assembly 24 defining a vacuum tight closure, as shown in FIG. 3. Further, residual air is removed from the interior of the can assembly 24 through a tube attached thereto (not shown).

Next, the can assembly 24 is placed in a HIP chamber 30 (FIG. 4) and is subjected to a HIP process at a predetermined temperature and pressure for a selected time period. The can assembly 24 is typically subjected to equal pressure from all sides by means of a pressurizing gas, usually argon. The particular conditions used for the HIP process are selected to meet the requirements necessary to achieve sound bonds between the target 12 and the interlayer 14, and between the interlayer 14 and the backing plate 16. In a preferred HIP process, the can assembly 24 may be subjected to a temperature of about 620° C. and a pressure of about 100 MPa for a time period of about three hours. Bonds having bond strengths as great as about 12 ksi (83 MPa) have been formed with this method. Hot isostatic pressing methods are described in more detail in U.S. Pat. No. 5,234,487, issued to Wickersham et al., and U.S. Pat. No. 5,230,459, issued to Mueller et al., the disclosures of which are incorporated herein by reference.

After the HIP process has been completed, the assembly may be pressed and machined if desired by conventional means to desired dimensions for the final target assembly 10.

Another preferred method for forming the diffusion bond is vacuum hot pressing, in which the preheated target 12, interlayer 14, and backing plate 16 combination is placed in a vacuum chamber and then pressed to promote bonding. The pressure applied during the bonding operation may vary over a wide range. The pressure and time required are controlled so that a strong bond is formed. Of primary importance is that the confronting surfaces of the target 12 and the backing plate 16 be forced to conform to each other to form a continuous interface between the target 12, interlayer 14, and backing plate 16 in the finished assembly 10.

Figure 5:
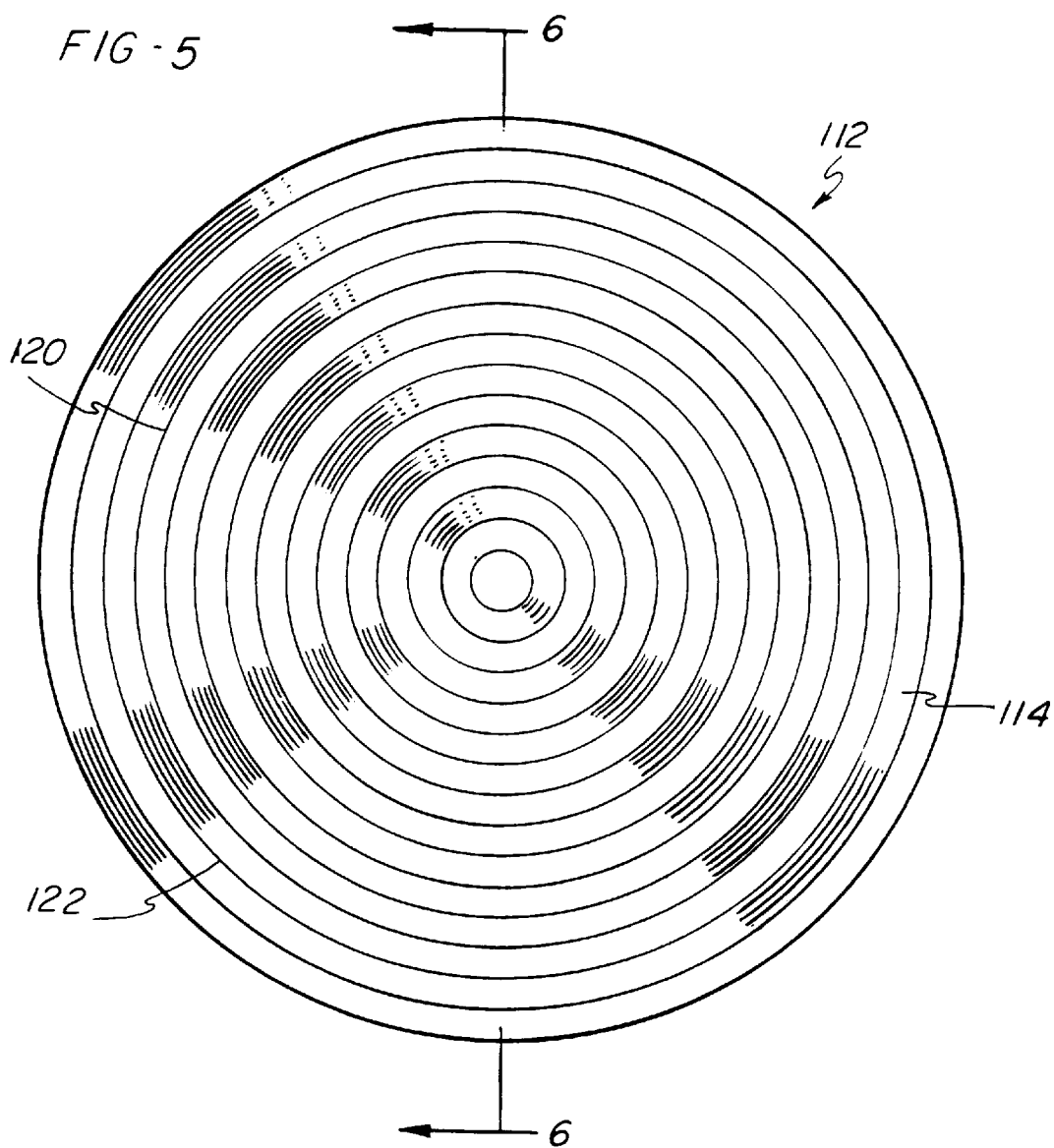
FIG. 5 is a bottom plan view of an alternative embodiment of a sputter target made in accordance with the invention.
Figure 6:
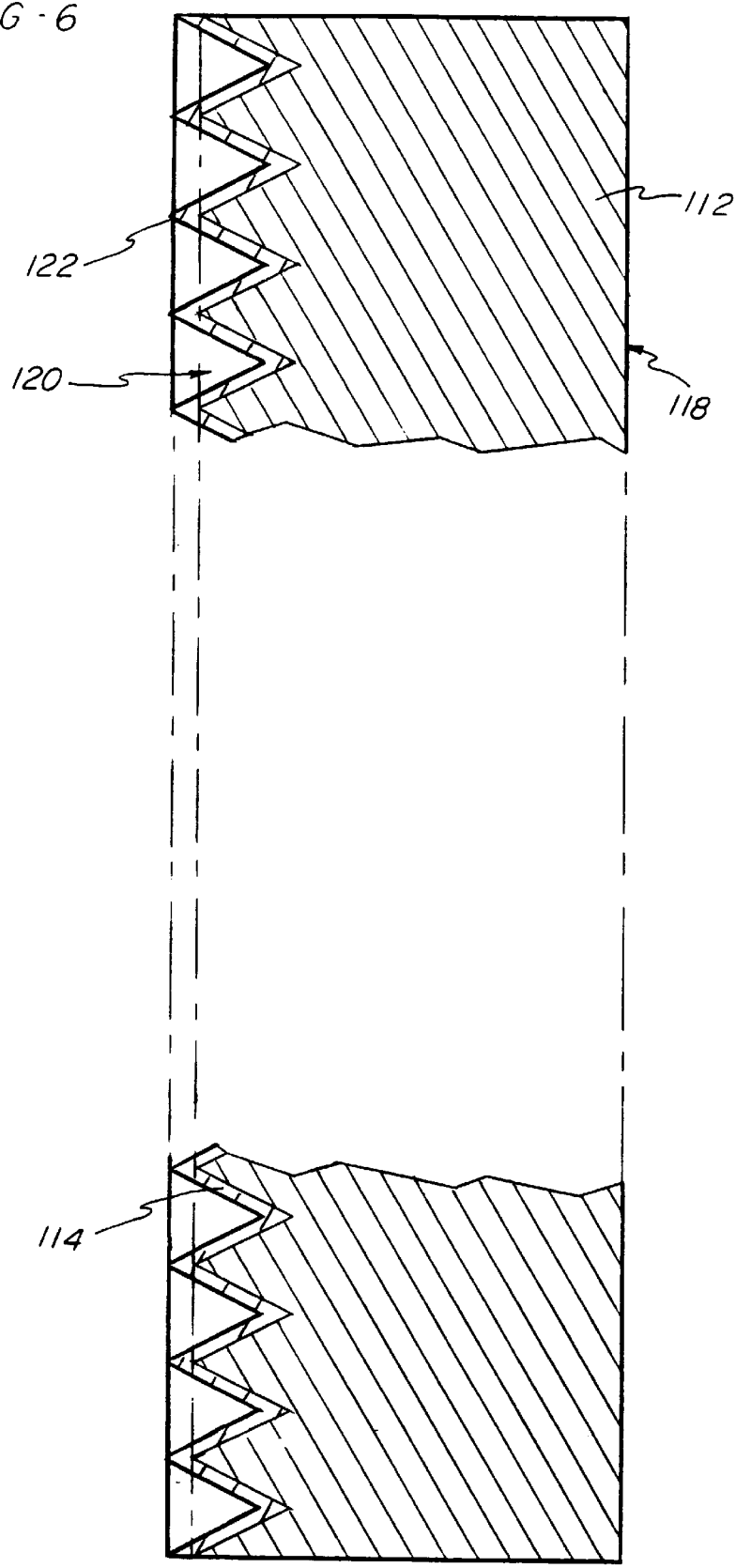
FIG. 6 is a cross-sectional elevation view of the sputter target of FIG. 5.

In another embodiment of the invention, prior to bonding the target, the interlayer, and the backing plate together, one of the interfacial surfaces of either the target or the backing plate may be roughened as by machining. Either the upper or mating side of the backing plate, or more preferably, the lower or mating side of the target, may be provided with a plurality of raised projections or salient points. As shown in FIGS. 5 and 6, a target 112 is provided with a plurality of annularly-shaped grooves 120 machined therein defining jagged V-shaped projections or ridges 122 therebetween. The grooves 120 are concentrically arranged and are approximately 0.010 to 0.020 inch (0.25 to 0.50 mm) deep, preferably about 0.010 inch (0.25 mm) deep.

While the invention is not limited to the use of concentric circular grooves such as those shown in FIGS. 5 and 6, and other patterns of roughening may be used, the use of concentric grooves forming closed or endless loops is preferred because any oxygen trapped in the metal surface will be impeded from migrating out of the surface during the sputtering operation. Such migration might contaminate the sputtering chamber and could lead to the formation of impurities on the sputter-coated substrate. The use of concentric circular grooves are especially preferred in that they are relatively easy to machine as compare to more complicated curves or figures.

While the invention has been described as employing a titanium foil as the interlayer 14, the interlayer 14 may be formed by other means. For example, the interfacial surface or underside of the targets 12, 112 may be provided with a layer of titanium or titanium alloy having a substantially uniform thickness, such as about 20 to 30 micron. Such an interlayer 114 is depicted in FIGS. 5 and 6. Preferably, the titanium interlayers 14, 114 have sufficient thickness such that the target material and the backing plate material each form independent metallurgical bonds with the interlayers 14, 114 during the diffusion bonding process and that the target and backing plate do not form substantial amounts of intermetallic phase therebetween. The interlayers 14, 114 may be deposited by conventional methods such as electroplating, sputtering, or electroless plating.

While the sputter target 12 shown in the figures is circular in cross-section, the invention is equally applicable to the fabrication of sputter target assemblies from sputter targets having rectangular or other cross-sectional shapes. Likewise, while the sputtering surfaces 18, 118 of the sputter targets 12, 112 are shown as planar, the technique of the invention is equally applicable to forming sputter target assemblies having different contours. One example of a sputter target assembly structure to which the method of the present invention may be applied is shown in FIGS. 4 and 5 of the aforementioned U.S. Pat. No. 5,230,459 to Mueller et al.

A series of experiments were conducted using Ti and Al/Cu sputter deposited interlayers. Results are shown in Table I.

TABLE I

HIP diffusion bonding parameters and bond strength results.

| Sample No. | Ti inter-layer | Sputter deposited interlayer | Bond-ing groove | HIP Temp. | HIP Pressure/ Time | Bond Strength or comments |
|---|---|---|---|---|---|---|
| 1 | Yes | No | No | 1150 F. (621 C.) | 15 ksi/3 h (103 MPa) | 12 Ksi (83 MPa) |
| 2 | Yes | No | No | 900 F. (482 C.) | 15 ksi/3 h (103 MPa) | weak bond |
| 3 | Yes | No | No | 750 F. (400 C.) | 15 ksi/3 h (103 MPa) | weak bond |
| 4 | No | No | Yes | 1050 F. (621 C.) | 15 ksi/3 h (103 MPa) | weak bond |
| 5 | No | No | Yes | 1050 F. (621 C.) | 15 ksi/3 h (103 MPa) | 4 ksi (31 MPa) |
| 6 | Yes | Al-0.5 Cu | No | 1050 F. (566 C.) | 15 ksi/3 h (103 MPa) | weak bond |
| 7 | Yes | Al-0.5 Cu | No | 900 F. (482 C.) | 15 ksi/3 h (103 MPa) | weak bond |

While the methods herein described, and the products produced by methods constitute preferred embodiments of this invention, it is to be stood that the invention is not limited to these precise methods and products, at changes may be made in either without departing from the scope of the ion which is defined in the appended claims.

What is claimed is:

1. A sputter target assembly comprising:
   a target comprising cobalt,
   a backing plate comprising aluminum or copper, and
   an interlayer comprising titanium between said target and said backing plate
   wherein said target, said interlayer, and said backing plate are diffusion bonded together.

2. Sputter target assembly as recited in claim 1 wherein said target, said interlayer, and said backing plate are diffusion bonded together by hot isostatic pressing.

3. Sputter target assembly as recited in claim 2 wherein said hot isotactic pressing is at a temperature of about 600° C., a pressure of about 100 MPa, and for a time of about 3 hours.

4. Sputter target assembly as recited in claim 1 wherein said target said interlayer, and said backing plate are diffusion bonded together by hot vacuum pressing.

5. A method of forming a sputter target assembly comprising the steps of:
   providing a target comprising cobalt and a first mating surface;
   providing a backing plate comprising aluminum or copper and a second mating surface;
   providing an interlayer comprising titanium; and
   pressing said first mating surface together with said second mating surface with said interlayer therebetween to bond said target to said backing plate.

6. The method of forming a sputter target assembly as recited in claim 5 wherein said step of pressing includes the steps of:
   placing said target in a hot isostatic press can;
   placing said interlayer in said can over said target; placing said backing plate in said can over said interlayer;
   securing a closure plate in said can to form a vacuum tight can assembly;
   evacuating residual air from said can assembly; and
   subjecting said can to a temperature and a pressure for a period of time, wherein said temperature is about 600 degrees Celsius, said pressure is about 100 MPa, and said period of time is about three hours.

7. The method of forming a sputter target recited in claim 5 wherein the step of providing an interlayer includes the step of depositing a layer of titanium about 1–50 microns thick on either said first mating surface or said second mating surface.

8. The method of forming a sputter target assembly recited in claim 5 further comprising the step of:
   subsequent to said step of providing a backing plate, forming salient points on one of said first and second mating surfaces.

9. The method of forming a sputter target assembly recited in claim 8 wherein said step of forming salient points includes machining a plurality of concentric grooves in one of said first and second mating surfaces.

10. The method of forming a sputter target assembly recited in claim 5 wherein said step of providing an interlayer includes providing a titanium foil.

* * * * *